US007255574B1

(12) United States Patent
Ju

(10) Patent No.: US 7,255,574 B1
(45) Date of Patent: Aug. 14, 2007

(54) ELECTRICAL CONNECTOR HAVING AN OSCILLATING MULTILAYERED CONDUCTING BODY

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/514,155

(22) Filed: Sep. 1, 2006

(51) Int. Cl.
*H01R 12/00* (2006.01)
*H05K 1/00* (2006.01)

(52) U.S. Cl. .......................................... 439/66; 439/886

(58) Field of Classification Search .................. 439/66, 439/91, 591
See application file for complete search history.

(56) References Cited

U.S. PATENT DOCUMENTS

| | | | | |
|---|---|---|---|---|
| 5,248,262 | A * | 9/1993 | Busacco et al. | 439/66 |
| 5,324,205 | A * | 6/1994 | Ahmad et al. | 439/66 |
| 5,588,846 | A * | 12/1996 | Irlbeck et al. | 439/66 |
| 5,599,193 | A * | 2/1997 | Crotzer | 439/66 |
| 5,632,626 | A * | 5/1997 | Collins et al. | 439/66 |
| 6,183,267 | B1 * | 2/2001 | Marcus et al. | 439/66 |
| 6,315,576 | B1 * | 11/2001 | Neidich | 439/66 |
| 6,640,432 | B1 * | 11/2003 | Mathieu et al. | 29/842 |
| 6,669,489 | B1 * | 12/2003 | Dozier et al. | 439/71 |
| 6,827,584 | B2 * | 12/2004 | Mathieu et al. | 439/66 |

FOREIGN PATENT DOCUMENTS

| | | |
|---|---|---|
| CN | 00217081.7 | 8/2001 |

* cited by examiner

*Primary Examiner*—Hae Moon Hyeon
(74) *Attorney, Agent, or Firm*—Rosenberg, Klein & Lee

(57) ABSTRACT

An electrical connector is used for connecting a chip module to a circuit board. The electrical connector includes an insulating body having a plurality of receiving holes, and conducting bodies located in the receiving holes. The conducting body includes a flexible body and a metal layer located on the outside of the flexible body. Because the conducting body of the electrical connector includes a flexible body and a metal layer located on the outside of the flexible body, the flexibility of the conducting body is assured. The external metal layer can make the chip module electrically connect firmly with the circuit board. Therefore, the connection between the chip module and the circuit board is assured.

28 Claims, 2 Drawing Sheets

ELECTRICAL CONNECTOR HAVING AN OSCILLATING MULTILAYERED CONDUCTING BODY

BACKGROUND OF THE INVENTION

1. Field of the Invention

The present invention relates to an electrical connector. In particular, this invention relates to a compressing contact electrical connector.

2. Description of the Related Art

The compressing contact electrical connector of the prior art generally includes an insulating body, and conducting pins received in the insulating body. The insulating body has pin-receiving grooves and the conducting pins are received in the pin-receiving grooves. The conducting pin includes a fastening part and two contacting parts located at two ends of the conducting pins. Two butting electronic elements are compressed so as to contact each other so that the two butting electronic elements are electrically connected together, such as in China patent, CN 00217081.7. However, because these conducting pins are manufactured from a general metal material, the shape is complex and the manufacturing process difficult. After the conducting pin is compressed or bent a number of times, the conducting pin becomes deformed and its flexibility worsens. Therefore, the contact between the electrical connector and the electronic element becomes worse in that the function of the electrical connector is affected.

SUMMARY OF THE INVENTION

One particular aspect of the present invention is to provide an electrical connector that firmly contacts the butting electronic element.

The present invention provides an electrical connector for connecting the chip module to the circuit board. The electrical connector includes an insulating body having a plurality of receiving holes, and conducting bodies located in the receiving holes. The conducting body includes a flexible body and a metal layer located on the outside of the flexible body.

Because the conducting body of the electrical connector includes a flexible body and a metal layer located on the outside of the flexible body, the flexibility of the conducting body is assured. The external metal layer makes the chip module electrically connect with the circuit board. Therefore, the connection between the chip module and the circuit board is assured.

The present invention also provides an electrical connector for connecting the chip module to the circuit board. The electrical connector includes an insulating body having a plurality of receiving holes, and conducting bodies located in the receiving holes. The conducting body includes a flexible body and a metal layer located on the outside of the flexible body. On the inner wall of the receiving hole, there is a positioning mechanism for positioning the conducting body.

Because there is a positioning mechanism for positioning the conducting body on the inner wall of the receiving hole, the described goals are achieved and the conducting body is firmly fastened in the insulating body.

The present invention provides an electrical connector for connecting the chip module to the circuit board. The electrical connector includes an insulating body having a plurality of receiving holes, and conducting bodies located in the receiving holes. The conducting body includes a flexible body and a metal layer located on the outside of the flexible body. The metal layer has at least one opening and the metal layer forms a conducting path.

Because the metal layer has at least one opening, the goals of the first embodiment are achieved and the chaps produced on the metal layer are avoided.

The present invention provides an electrical connector for connecting the chip module to the circuit board. The electrical connector includes an insulating body having a plurality of receiving holes, and conducting bodies located in the receiving holes. The conducting body includes a flexible body and a metal layer located on the outside of the flexible body. Two contacting points are located on the conducting body that individually protrude to the upper surface and the lower surface of the insulating body, and a line connected between the two contacting points and the upper surface of the insulating body has an angle.

Because the line connected between the two contacting points and the upper surface of the insulating body has an angle, the contacting points are not located at a vertical straight line. When the conducting body is compressed, the conducting body can deform and oscillates to reduce the force imposed on the contacting points. The goals of the first embodiment are achieved and the chaps produced on the metal layer are avoided.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
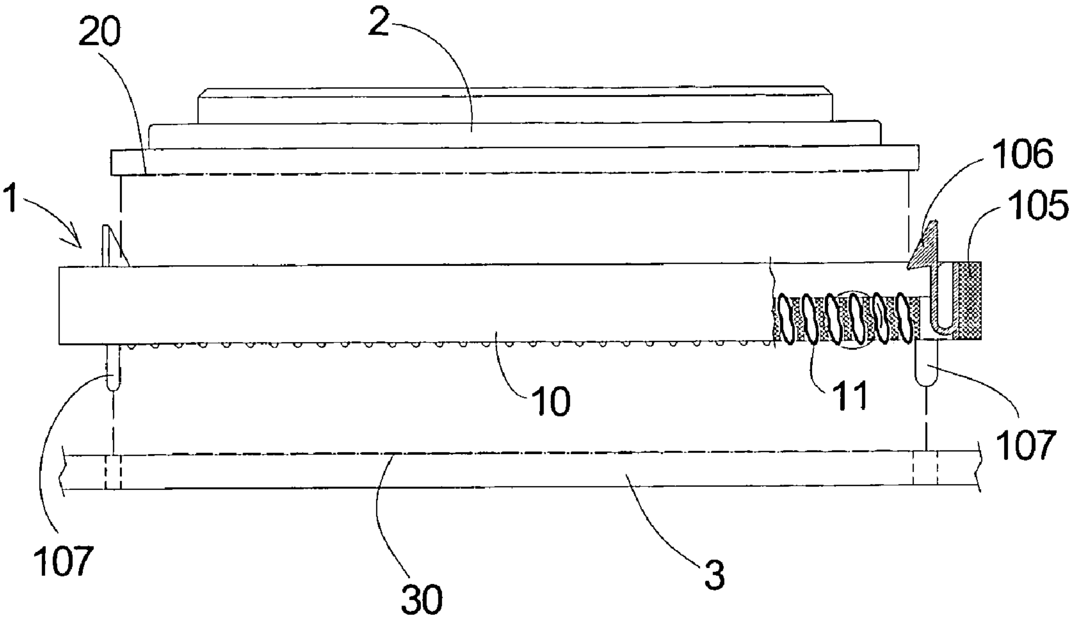
FIG. 1 is an exploded schematic diagram of the electrical connector, the chip module and the circuit board of the present invention.
Figure 2:
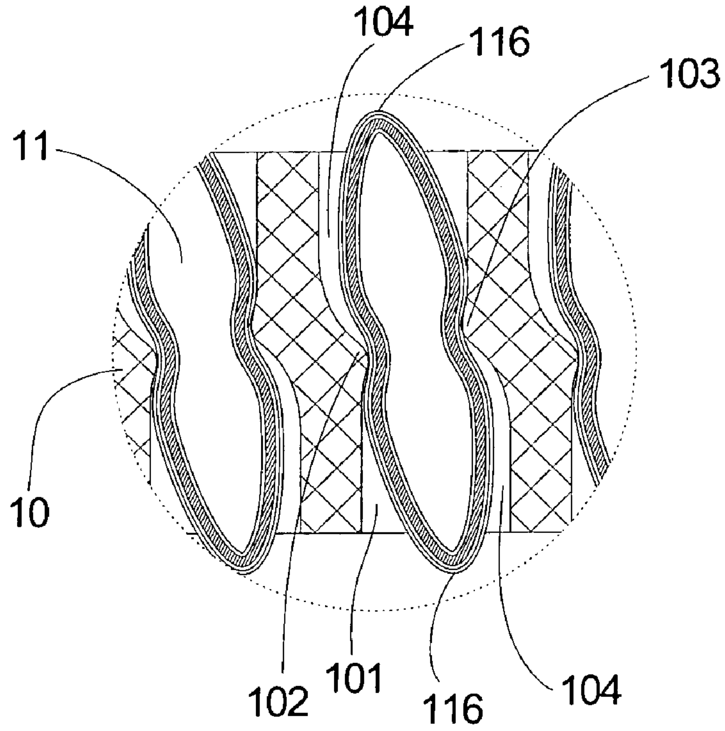
FIG. 2 is an amplified diagram of part of the electrical connector of FIG. 1.
Figure 3:
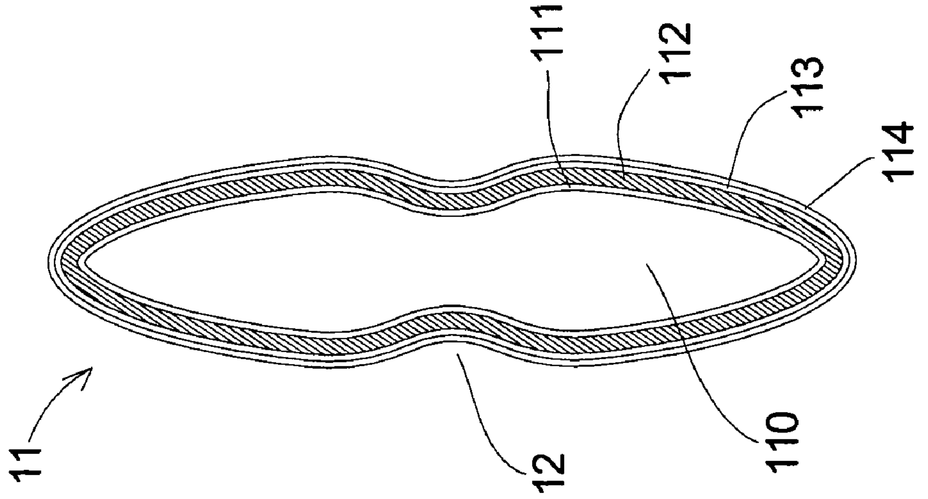
FIG. 3 is an amplified diagram of the conducting body of the electrical connector of FIG. 1.

Reference is made to FIGS. 1~3. The electrical connector 1 of the present invention is used for connecting the chip module 2 to the circuit board 3. The electrical connector 1 includes an insulating body 10 and conducting bodies 11.

The insulating body 10 has a plurality of receiving holes 101 that pass through the upper surface and the lower surface of the insulating body 10. The conducting bodies 11 are received in the receiving holes 101. On the inner wall of the receiving hole 101, there is a positioning mechanism for positioning the conducting body 11. In this embodiment, the positioning mechanism is comprised of two protruding parts 102, 103 that are located at two sides of the inner wall of the receiving hole 101 and are staggered to each other in a vertical direction. When the conducting body 11 is compressed, the conducting body 11 can oscillate in the receiving hole 101. At the upper and lower corresponding locations of the inner wall of the receiving hole 101 in the conducting body's oscillating direction, yielding spaces 104 are concavely formed. The yielding spaces 104 are respectively located at the inner wall above the protruding part 102 and the inner wall below another protruding part 103 that are staggered to each other in vertical directions. There is a positioning convex wall 105 around the insulating body 10. On the positioning convex wall 105, there is a flexible body 106 that can wedge against the upper surface of the chip module 2. At least two positioning columns 107 extend downwards from the bottom of the insulating body 10. The sizes of the two positioning columns 107 are different. When the electrical connector is installed on the circuit board 3, the two positioning columns 107 provide a foolproof function that improves the assembling efficiency.

Fitting parts 12 are concaved at two sides of the conducting body 11 that match the positioning mechanism. The conducting body 11 includes a flexible body 110 and multiple metal layers located on the outside of the flexible body 110. The flexible body 110 is a non-conducting material. The multiple metal layers include: a first metal layer 111 that is coated on the flexible body 110 via a physical coating method (such as a vacuum evaporation, or a vacuum sputtering) or other coating methods; a second metal layer 112 coated on the first metal layer 111 via an electroplating method; a nickel layer 113 coated on the second metal layer 112; and an external metal layer 114 coated on the nickel layer 113.

The first metal layer 111 is a copper layer. The second metal layer 112 increases the thickness of the first metal layer 111. The second metal layer 112 is also a copper layer and the thickness of the second metal layer 112 is greater than that of the first metal layer 111. The external metal layer 114 is a gold layer. The nickel layer 113 increases abrasion resistance and corrosion resistance. The external metal layer 114 is a gold layer that increases the electric conductivity of the conducting body and lowers its resistance. In order to easily coat the first metal layer on the flexible body, a medium layer (not shown in the figure) is added on the external surface of the flexible body in advance so as to increase the adhesive force of the first metal layer (except the second metal layer, the thickness of the layers are thinner and different cross-sectional lines are used in the cross-sectional view for identifying their outlines).

After the conducting body 11 is installed in the receiving hole 101 of the insulating body 10, the fitting part 12 fits into and is positioned with the two protruding parts 102, 103. The conducting body 111 is inclined and received in the receiving hole 101. Two ends of the conducting body 11 protrude to the outside of the upper surface and the lower surface of the insulating body 10 to form contacting points 116. The line connected between the two contacting points 116 and the upper surface of the insulating body 10 has an angle. The contacting points 116 are not located at a vertical straight line. When the electrical connector 1 is connected with the chip module 2 and the circuit board 3, the contacting points 116 are connected with the conducting flake 20 on the chip module 2 and the conducting flake 30 on the circuit board 3. The conducting body 11 is compressed and oscillates to the yielded space 104. Because the protruding parts 102, 103 are staggered at different heights in the vertical direction, the conducting body 11 tilts to and is fastened between the two protruding parts 102, 103 firmly. Because the two contacting points 116 are not located on the same vertical straight line, part of the conducting body 11 can deform and oscillate sideways when the conducting body 11 is compressed. Furthermore, the conducting body 11 can deform in the yielded space 104 when the conducting body 11 is compressed. Therefore, the chap required on the metal layer (in the prior art) is unnecessary when a larger force is exerted on the contacting points 116.

The conducting body of the electrical connector has a flexible body and a plurality of conducting layers on the flexible body. The flexibility of the conducting body is good and assured. The metal layers implement the electrical conduction between the chip module and the circuit board, and the connection between the chip module and the circuit board is also assured so as to solve the problem of the prior art.

Figure 4:
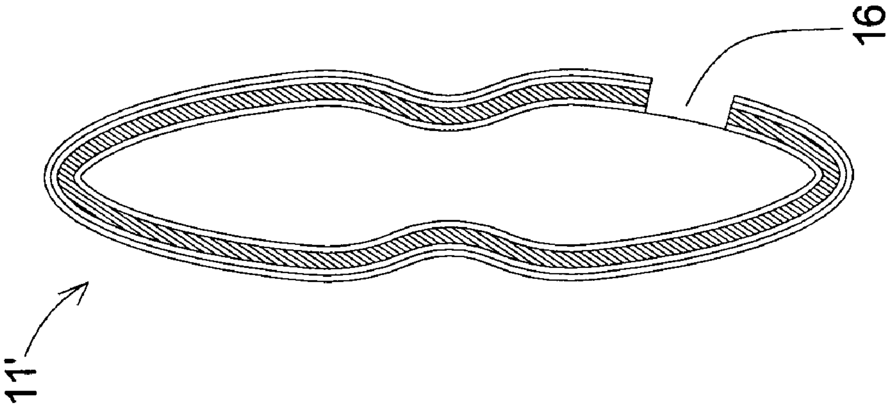
FIG. 4 is a schematic diagram of the conducting body of the second embodiment of the electrical connector of the present invention.

Reference is made to FIG. 4, which shows a schematic diagram of the conducting body of the second embodiment of the electrical connector of the present invention. The difference between the second embodiment and the first embodiment is that the metal layer located on the conducting body has an opening 16. However, the metal layer can still form a conducting path. The conducting body 11' has improved flexibility and is not easily chapped when the conducting body is compressed. Alternative, there are two or more openings on the metal layer if the conducting body can still form a conducting path.

Figure 5:
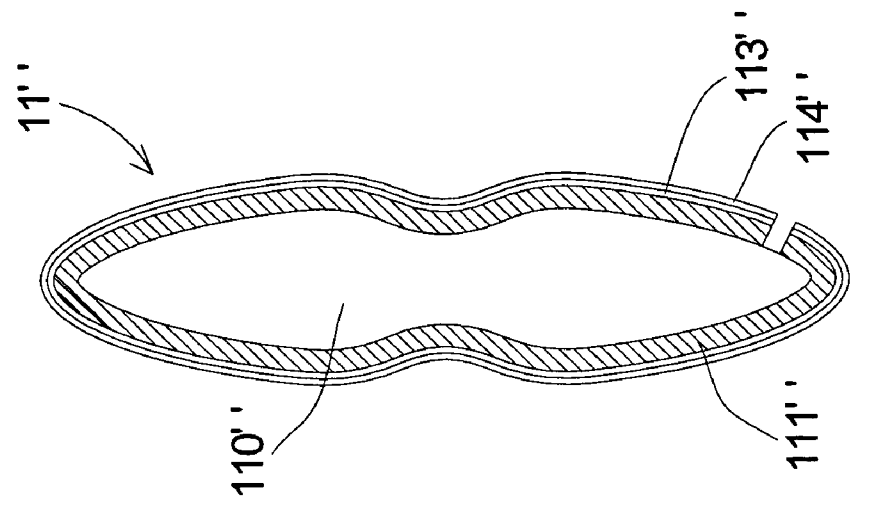
FIG. 5 is a schematic diagram of the conducting body of the third embodiment of the electrical connector of the present invention.

Reference is made to FIG. 5, which shows a schematic diagram of the conducting body of the third embodiment of the electrical connector of the present invention. The difference between the second embodiment and the first embodiment is that the first metal layer 111" is wrapped around the flexible body 110" of the conducting body 11" and is a thin copper layer 111". The outer surface of the copper layer 111" is coated with a nickel layer 113". The outer surface of the nickel layer 113" is coated with an external metal layer 114". The external metal layer 114" is a gold layer. The embodiment can also achieve the goals of the first embodiment.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An electrical connector, for connecting a chip module to a circuit board, the electrical connector comprising:

an insulating body having a plurality of receiving holes and conducting bodies located in the receiving holes, said conducting body including a flexible body, a first metal layer located on an outside of the flexible body, an external metal layer positioned on an outside of said first metal layer and a nickel layer coated between said first metal layer and said external metal layer.

2. The electrical connector as claimed in claim 1, wherein the first metal layer is coated on the outside of the flexible body, and the external metal layer is coated on the outside of the first metal layer.

3. The electrical connector as claimed in claim 2, wherein the first metal layer is a copper layer.

4. The electrical connector as claimed in claim 2, wherein the external metal layer is a gold layer.

5. The electrical connector as claimed in claim 2, wherein a nickel layer is coated between the first metal layer and the external metal layer.

6. The electrical connector as claimed in claim 2, wherein a second metal layer is located between the first metal layer and the external metal layer.

7. The electrical connector as claimed in claim 6, wherein the second metal layer is a copper layer.

8. The electrical connector as claimed in claim 1, wherein the first metal layer is a copper layer.

9. The electrical connector as claimed in claim 1, wherein the external metal layer is a gold layer.

10. The electrical connector as claimed in claim 1, wherein part of the conducting body deforms and oscillates sideways when the conducting body is compressed.

11. The electrical connector as claimed in claim 10, wherein the corresponding upper and lower locations in the inner wall of the receiving hole are concave so as to form yielding spaces in the conducting body oscillating direction.

12. An electrical connector, for connecting a chip module to a circuit board, the electrical connector comprising:

an insulating body having a plurality of receiving holes and conducting bodies located in the receiving holes, the conducting body including a flexible body, a first metal layer located on the outside of the flexible body, an external metal layer positioned on an outside of said first metal layer and a nickel layer coated between said first metal layer and said external metal layer; and a positioning mechanism positioned on an inner wall of the receiving hole for positioning and fixing the conducting body therein.

13. The electrical connector as claimed in claim 12, wherein the conducting body comprises a fitting part for fitting into the positioning mechanism.

14. The electrical connector as claimed in claim 12, wherein the positioning mechanisms are respectively located at the protruding parts of two sides of the inner wall of the receiving hole.

15. The electrical connector as claimed in claim 14, wherein the protruding parts located at two sides of the receiving hole are staggered to each other in a vertical direction.

16. The electrical connector as claimed in claim 12, wherein part of the conducting body deforms and oscillates sideways when the conducting body is compressed.

17. The electrical connector as claimed in claim 16, wherein the corresponding upper and lower locations in the inner wall of the receiving hole are concave so as to form yielding spaces in the conducting body oscillating direction.

18. An electrical connector, for connecting a chip module to a circuit board, the electrical connector comprising:

an insulating body having a plurality of receiving holes and conducting bodies located in the receiving holes, the conducting body including a flexible body, and a first metal layer located on the outside of the flexible body, an external metal layer positioned on an outside of said first metal layer, and a nickel layer coated between the first metal layer and the external metal layer, wherein said first metal layer has at least one opening and the first metal layer forms a conducting path.

19. The electrical connector as claimed in claim 18, wherein the first metal layer is coated on the outside of the flexible body, and the external metal layer is coated on the outside of the first metal layer.

20. The electrical connector as claimed in claim 19, wherein the first metal layer is a copper layer.

21. The electrical connector as claimed in claim 19, wherein the external metal layer is a gold layer.

22. The electrical connector as claimed in claim 19, wherein a nickel layer is coated between the first metal layer and the external metal layer.

23. The electrical connector as claimed in claim 19, wherein a second metal layer is located between the first metal layer and the external metal layer.

24. The electrical connector as claimed in claim 23, wherein the second metal layer is a copper layer.

25. The electrical connector as claimed in claim 18, wherein the first metal layer is a copper layer.

26. The electrical connector as claimed in claim 18, wherein the external metal layer is a gold layer.

27. The electrical connector as claimed in claim 18, wherein part of the conducting body deforms and oscillates sideways when the conducting body is compressed.

28. The electrical connector as claimed in claim 27, wherein the corresponding upper and lower locations in the inner wall of the receiving hole are concave so as to form yielding spaces in the conducting body oscillating direction.

* * * * *